(12) United States Patent
Wilmot et al.

(10) Patent No.: US 7,144,792 B2
(45) Date of Patent: Dec. 5, 2006

(54) METHOD AND APPARATUS FOR FABRICATING AND CONNECTING A SEMICONDUCTOR POWER SWITCHING DEVICE

(75) Inventors: Theodore S. Wilmot, Fort Collins, CO (US); John C. Driscoll, Raleign, NC (US); Eugene N. Bryan, Raleigh, NC (US)

(73) Assignee: Woodward Governor Company, Ft. Collins, CO (US)

( * ) Notice: Subject to any disclaimer, the term of this patent is extended or adjusted under 35 U.S.C. 154(b) by 0 days.

(21) Appl. No.: 10/975,830

(22) Filed: Oct. 28, 2004

(65) Prior Publication Data

US 2006/0097362 A1  May 11, 2006

(51) Int. Cl.
*H01L 21/78* (2006.01)
*H01L 21/46* (2006.01)
*H01L 21/301* (2006.01)

(52) U.S. Cl. .................. 438/460; 257/119; 257/147; 257/666

(58) Field of Classification Search .............. 438/460
See application file for complete search history.

(56) References Cited

U.S. PATENT DOCUMENTS 5,981,982 A * 11/1999 Driscoll ............... 257/138
2003/0218257 A1 * 11/2003 Ishio et al. ............ 257/781
2005/0003633 A1 * 1/2005 Mahle et al. .......... 438/463

* cited by examiner

*Primary Examiner*—Tu-Tu Ho
(74) *Attorney, Agent, or Firm*—Greer, Burns & Crain, Ltd.

(57) ABSTRACT

Fabrication processes for manufacturing and connecting a semiconductor switching device are disclosed, including an embodiment for dicing a wafer into individual circuit die by sawing the interface between adjacent die with a saw blade that has an angled configuration across its width, preferably in a generally V-shape so that the adjacent die are severed from one another while simultaneously providing a beveled surface on the sides of each separated die. Another embodiment relates to the manner in which damage to a beveled side surface of the individual die can be smoothed by a chemical etching process. Another embodiment relates to the manner in which the device can be easily mounted on a printed circuit board by providing conductive lands on the printed circuit board that are coextensive with metallized electrodes on the device and which can be placed on the printed circuit board and soldered in place and a unique lead frame which can be soldered to another electrode metallization on the opposite side of the chip and the printed circuit board in a manner which substantially reduces if not eliminates harmful thermal stress and which assures secure bonding notwithstanding elevation differences between the electrode metallization and the printed circuit board the lead frame is attached to. Another embodiment relates to an output connector for interconnecting an exciter circuit product with a spark producing device wherein the output connector utilizes a configuration that includes a sealing structure that is reliable and easily installed.

15 Claims, 6 Drawing Sheets

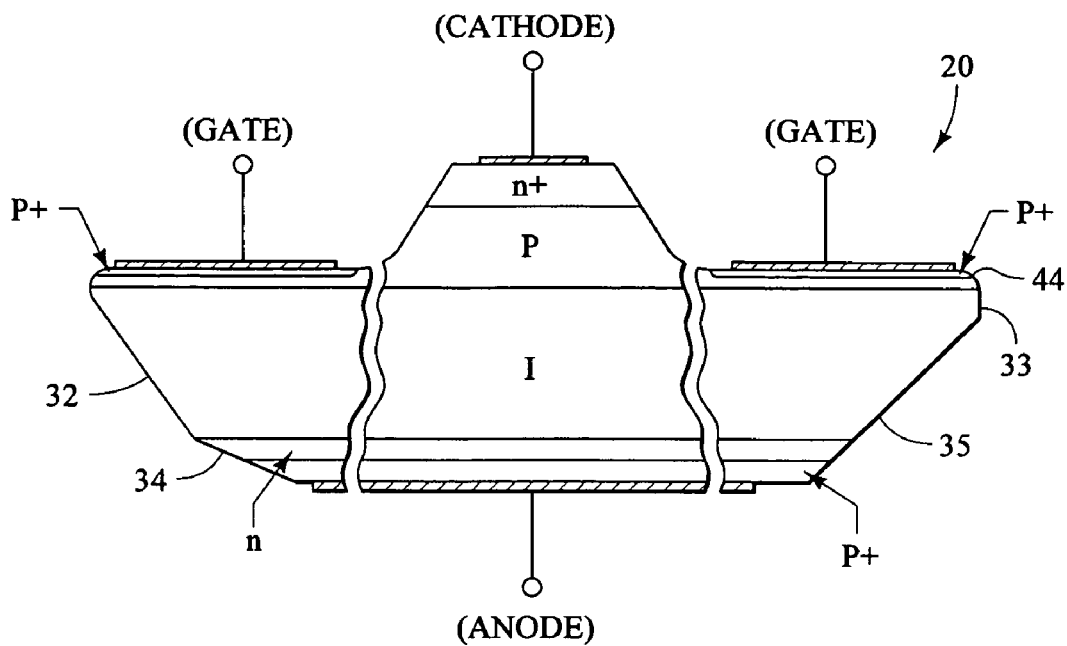
FIG. 3
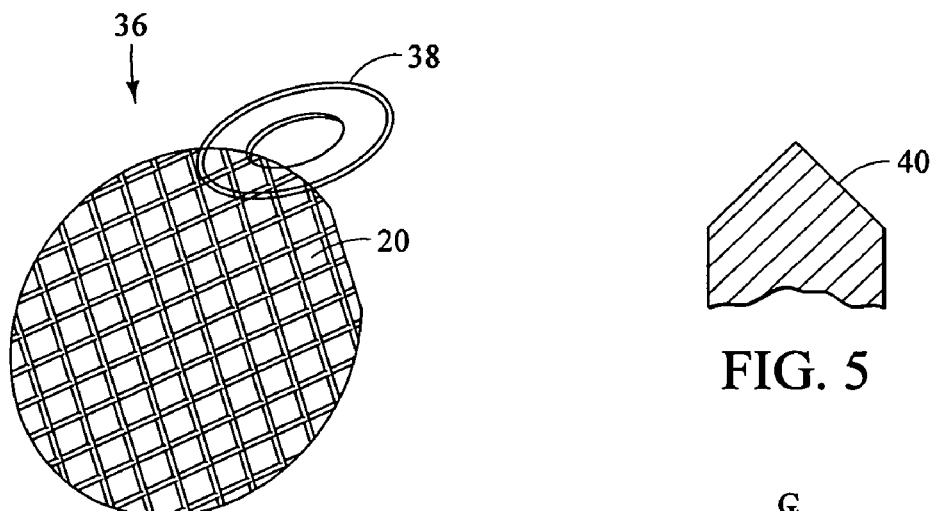
FIG. 4
FIG. 5
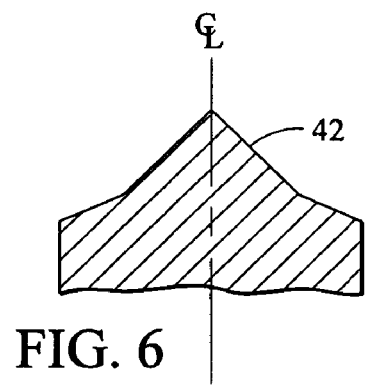
FIG. 6

METHOD AND APPARATUS FOR FABRICATING AND CONNECTING A SEMICONDUCTOR POWER SWITCHING DEVICE

CROSS REFERENCE TO RELATED APPLICATIONS

A Solid State Turbine Engine Ignition Exciter Having Elevated Temperature Operational Capability, filed Jun. 15, 2004, Ser. No. 10/868,621, by Theodore S. Wilmot, John C. Driscoll and Richard S. Brzostek.

BACKGROUND OF THE INVENTION

The present invention generally relates to semiconductor fabrication and connection methods and apparatus, and more particularly to fabrication and connection methods and apparatus high voltage semiconductor power switching devices that are useful in ignition exciters for turbine engine applications.

Modern turbine engine ignition exciters, especially those used in small gas turbine applications, have evolved considerably in recent years; migrating from spark gap (plasma) switching devices and simple relaxation type oscillator charge pumps to more reliable and predictable solid state switching devices with digitally controlled DC-DC converter charge pumps. Thermal performance of current art solid state ignition exciters has been limited due to available thyristor switching technology. Some designs use multiple series stacked phase control thyristors with saturable reactors, while others employ switching devices specifically designed for pulse power applications. However, performance of both suffer from leakage current related limitations of the switching devices. At elevated temperatures, leakage current within the switching device results in increased power dissipation. This condition precipitates additional leakage current, resulting in a thermal runaway condition and device failure.

The most advanced current art exciters employ pulse type thyristors to eliminate the need for saturable magnetic components in the output stage and the associated limitations of that technology. While a considerable improvement over phase control based designs, thermal performance of current art pulse thyristor based ignition exciters is still limited by switching device leakage current. Moreover, current art technology incorporates costly semiconductor die manufacturing and device packaging techniques limiting commercial viability of the ignition exciters.

The ignition exciter embodiments in the above referenced Wilmot et al. application utilize a semiconductor pulse switching device that is designed to exhibit low leakage current at elevated ambient temperatures. It has a design configuration that is disclosed in the Wilmot et al application and in above referenced Driscoll et al. patent application. The design configuration also facilitates the use of novel fabrication and mounting processes and apparatus which greatly reduces the cost of manufacturing and connecting the semiconductor pulse switching device in an exciter product.

SUMMARY OF THE INVENTION

Preferred embodiments of the present invention relate to fabrication processes for manufacturing a semiconductor switching device. One embodiment relates to the manner in which a semiconductor chip is fabricated with regard to the separation of a plurality of individual circuit die that are formed on a wafer, wherein the wafer is diced into individual circuit die by sawing the interface between adjacent die with a saw blade that has an angled configuration across its width, preferably in a generally V-shape so that the adjacent die are severed from one another while simultaneously providing a beveled surface on the sides of each separated die.

Another embodiment of the present invention relates to the manner in which damage to the beveled side surface of the individual die can be smoothed by an etching process.

Still another embodiment of the present invention relates to the manner in which the device can be easily mounted on a printed circuit board by providing conductive lands on the printed circuit board that are coextensive with metallized electrodes on the device and which can be placed on the printed circuit board and soldered in place.

Still another embodiment relates to a unique lead frame which can be soldered to another electrode metallization on the opposite side of the chip and the printed circuit board in a manner which substantially reduces if not eliminates harmful thermal stress and which assures secure bonding notwithstanding elevation differences between the electrode metallization and the printed circuit board the lead frame is attached to.

Still another embodiment of the present invention relates to an output connector for interconnecting an exciter circuit product with a spark producing device wherein the output connector utilizes a configuration that includes a sealing structure that is reliable and easily installed.

BRIEF DESCRIPTION OF THE DRAWINGS

FIG. 3 is another cross-sectional view with portions removed similar to that shown in FIG. 2, but illustrating a device having sides with a double bevel geometry;

FIG. 4 is an idealized perspective view of a wafer having a plurality of individual die formed therein and illustrating a diagrammatic saw blade for separating the individual die and simultaneously producing a chip having a beveled side geometry;

FIG. 5 is a cross-sectional view of a portion of a circular abrasive saw blade having an angled configuration across its width to dice a wafer and produce the devices with a single bevel as shown in FIG. 2;

FIG. 6 is a cross-sectional view of a portion of a circular abrasive saw blade that has a double bevel angle V-shape configuration for producing the die having the double bevel sides as shown in FIG. 3;

DETAILED DESCRIPTION OF THE PREFERRED EMBODIMENTS

While the present invention relates to a semiconductor pulse switching device that is particularly useful in implementing exciter circuitry for turbine engine ignition systems and particularly aircraft engine ignition exciter circuits, the fabrication processes and techniques that are described herein are applicable to fabricating and connecting other semiconductor devices having other applications. However, the processes and apparatus that are disclosed herein are particularly configured for use in high power circuitry where large currents may flow for short periods of time. Because high load transitory conditions may be commonplace for such devices, the fabrication and connecting processes and apparatus described herein may be useful across a wide variety of applications where high current flow may occur.

Figure 1:
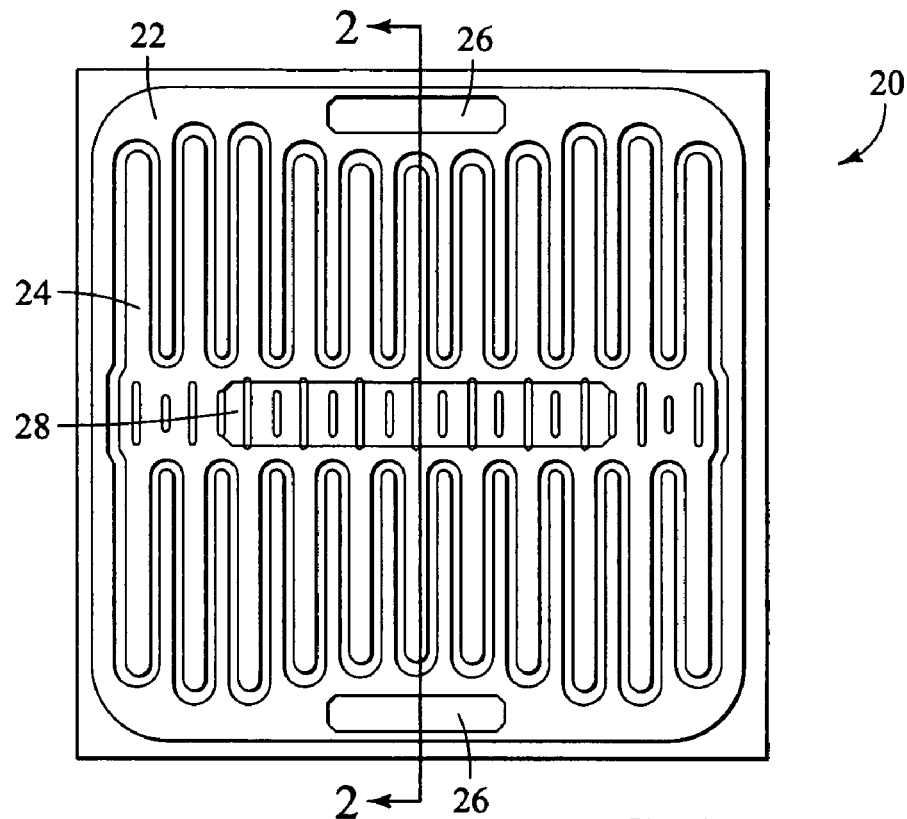
FIG. 1 is a plan view that illustrates a power switching device (PSD) die configuration and gate and cathode metallization geometry.

Referring to FIG. 1, an exemplary PSD switching device is illustrated generally at 20. The highly interdigitated gate-cathode structure of this device allows direct switching of high di/dt current pulses without the need for protective (saturable reactor) networks. More particularly, a gate structure 22 is interdigitated with a cathode structure 24. The gate structure 22 has two metalization pads 26 that are preferably soldered to lands (not shown in this figure) of a printed circuit board to which it is connected. The cathode structure 24 has a metalization pad 28 that also facilitates connection with the printed circuit board to which it is mounted. The compact die footprint (preferably approximately 0.38 inches square) and a thin base geometry improves switching speed by approximately 40% compared to prior art (approximately 0.5" diameter) pulse thyristor devices having a circular configuration.

Figure 2:
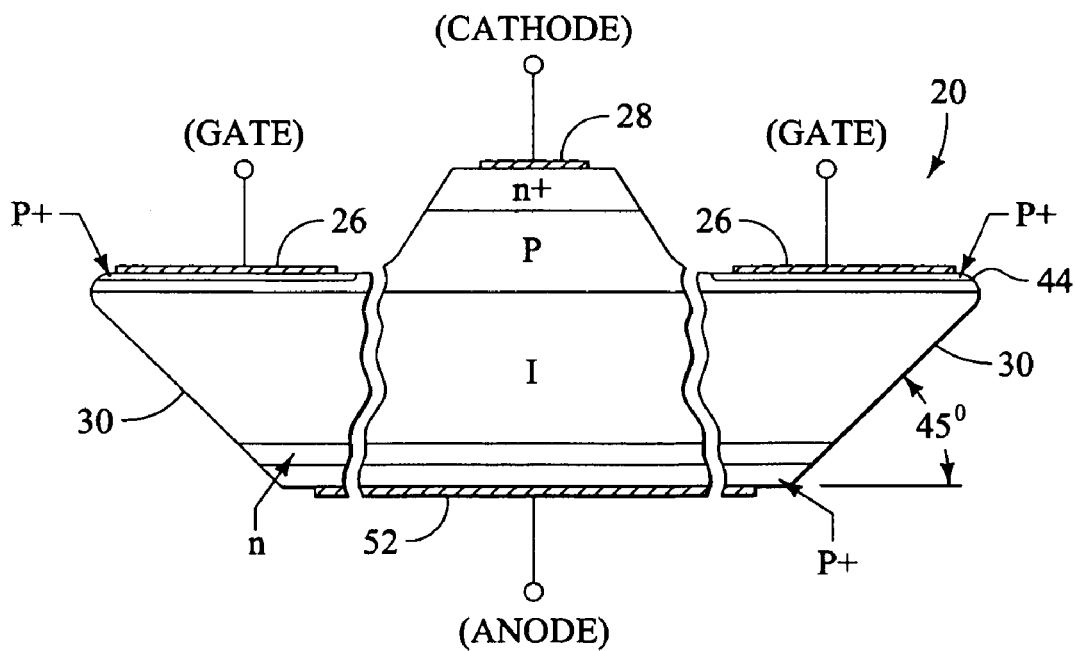
FIG. 2 is a cross-sectional view with portions removed taken generally along the line 2—2 of FIG. 1 and illustrating the bevel geometry of one embodiment of a PSD die configuration.

FIG. 2 illustrates a cross section of PSD switching device which has a thickness that is preferably only about 0.024 inches, with the (I) region approximating 0.018 inches. As shown in FIG. 2, the sides of the switching device 20 have a beveled surface which in FIG. 2 is approximately 45°. Since the device is substantially square, the 45° bevel on sides 30 is achieved during the dicing process of fabrication. While the embodiment shown in FIG. 2 has a single bevel side of 45°, the device may be made with alternate (e.g., 57.40°) or multiple bevel angles such as is shown in FIG. 3. In this embodiment, a substantial portion of the device has a bevel angle of approximately 57° along surface 32 that merges with a bevel angle 34 that is much shallower and is preferably within the range of approximately 3 to approximately 10° relative to horizontal. While not particularly relevant to the manner in which the bevels are fabricated, it should be pointed out that the double bevel may be desirable when the operating voltage of the device is higher, i.e., substantially greater than 1850 volts and that the single bevel of approximately 45° is sufficient to operate in a reliable manner. If the operating voltage is less than approximately 1850 VDC is utilized, it is possible to not have a bevel at all and the sides of the device may be perpendicular to the plane of the top and bottom surfaces of the device 20.

More significantly, the device 20 is preferably made using conventional techniques by producing a wafer 36 that is circular and includes a plurality of individual die 20. As is conventional, the wafer 36 is diced into individual chips and in one embodiment of the present invention, a circular saw blade 38 is used to cut adjacent die from one another for further processing. This is done using saw blades that are made to order and have a cross-sectional profile that is configured to produce either a single bevel 30 as shown in FIG. 2 or a double bevel 32 and 34 as shown in FIG. 3. A cross section of a saw blade that will separate adjacent die at a uniform 45.0° angle is shown in FIG. 5 which is configured to provide the 45.0° angle on both of the adjacent die sides 40 as well as to sever them from one another during the sawing process. In another embodiment, a straight cut (standard in the industry) is used to separate the individual die, illustrated by the 90° to normal angle 33, while a secondary bevel cut is used to form the electric field spreading bevel 35. Similarly, the configuration of the blade 42 has a double bevel configuration from both sides to the middle thereof which will produce the double bevel sides 32 and 34 as shown in FIG. 3. While the saw blades of FIGS. 5 and 6 are shown to have a single point in the center thereof, it should be understood that the center may be a relatively narrow point or it can be a wider pointed center portion as desired. In this regard, both FIGS. 2 and 3 have a slightly curved portion 44 that returns toward the center of the device. Utilization of a single bevel, double bevel, or a straight transverse cut for the sides is dictated by the operating voltages of the chip and the electric field characteristics that may affect the operability of the device 20. With regard to this embodiment of the present invention, the significant aspect of the present invention is that saw blades can have an outer cross-sectional configuration to produce the appropriate single angle bevel, as well as a double angle bevel and potentially additional angle bevels as desired.

The saw blades are diamond grit; preferably approximately 17 micron grit size. The blades are typically approximately 2 to 2.5" diameter and are approximately 0.06" thick and are generally rotated at speeds of approximately 20,000 rpm. The blades 38 are generally made to order, such that alternate diameters and special thicknesses are possible. There is a standard hub size that is used in the industry.

Figure 7:
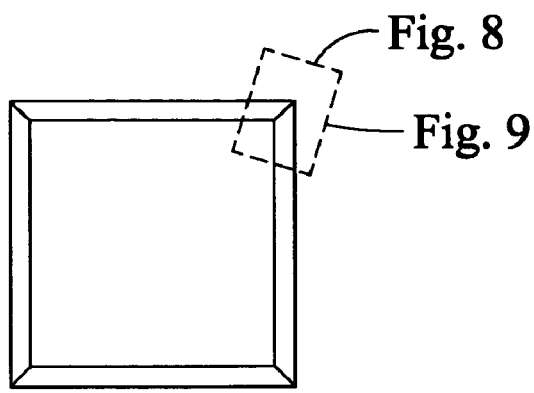
FIG. 7 is a diagrammatic plan view of the PSD shown from the bottom thereof illustrating the single bevel sides as shown in FIG. 2.
Figure 8:
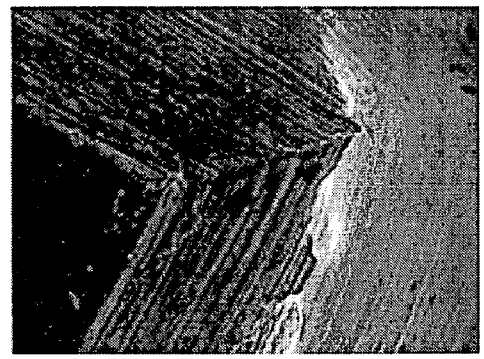
FIG. 8 is a microphotograph of a portion of an actual PSD illustrating the topography of the sides after dicing with a saw blade having the configuration shown in FIG. 5. The microphotograph illustrating the device has a magnification factor of 1500× and illustrates the contrast in surface quality between dicing damage and etch removal.
Figure 9:
FIG. 9 is a microphotograph of a portion of a chip similar to FIG. 8 illustrating the texture of the sides after etching, the microphotograph having a magnification factor of 130×.
Figure 10:
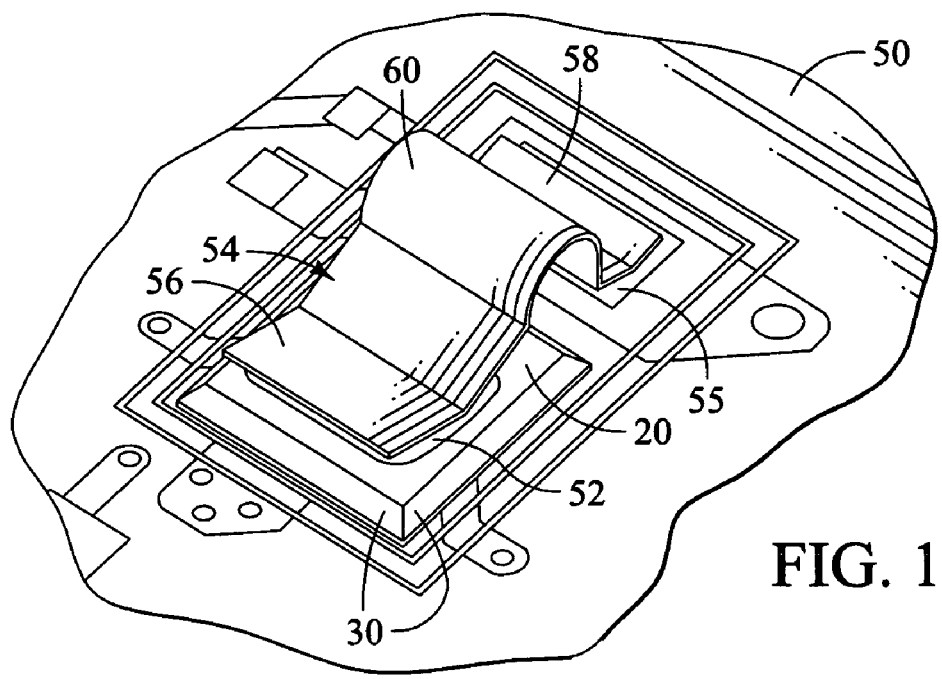
FIG. 10 is a perspective view illustrating a PSD mounted to a printed circuit board and particularly illustrating a lead frame which interconnects an electrode metallization to a land of the printed circuit board.
Figure 11:
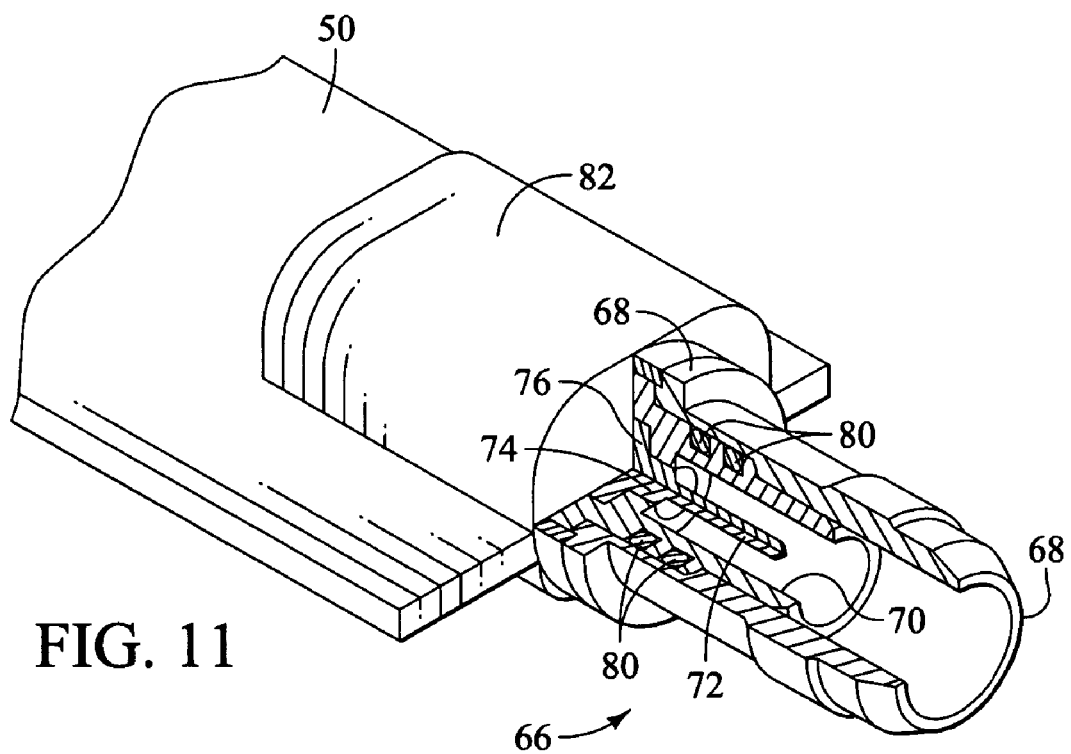
FIG. 11 is a perspective view of an output connector for an exciter circuit mounted on a printed circuit board, the connector being connectable to a cable that extends to a spark generating device.
Figure 12:
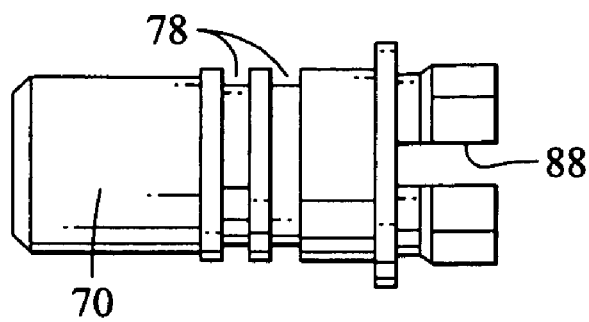
FIG. 12 is a plan view of the cylindrical insulator component of the output connector.

A bottom view of the device 20 is shown in FIG. 7 in a diagrammatical manner and the upper right-hand corner is shown to illustrate a portion of a corner of two sides that are shown in the microphotographs of FIGS. 8 and 9. With respect to FIG. 8, it illustrates at 1500 power magnification the shape of two sides and an intersecting corner and illustrates the contrast between damage that is exhibited from the grinding or sawing operation and the resulting surface after etching. Depending upon the voltage level of the circuit in which the device is being employed, the electric fields that are generated during operation may affect the reliability of the device over time. With regard to the embodiment shown in FIG. 2 which has a 45.0° bevel on the sides 30, it has been found that the damage that is exhibited to the side surface by the operation of the saw blade can be substantially removed, if not eliminated by an etching process. In this regard, immersing the chips in a silicon etchant that is comprised principally of 33 parts by volume Nitric acid, 25 parts Hydrofluoric acid, 20 parts Acetic acid and 20 parts Phosphoric acid, which results in a chemically etching operation that effectively cleaves off damaged portions that are normal to the 45.0° plane of the side of the device so that the resulting surface is mirror-like smooth as is shown in FIG. 9. Alternately, in yet another embodiment, if the silicon crystal has a 1,0,0 crystal orientation, a KOH (Potassium Hydroxide) etching process can be used to similarly smooth damage normal to a 57.4° bevel angle. It has also been found that the chemical etching process is preferably conducted while using ultrasonic agitation. This is accomplished by gently agitating the chips at a relatively low rate of about 10 to about 100 Hz while in the ultrasonic bath, which prevents the formation of bubbles on the surface of the chips.

In accordance with another embodiment of the present invention, the device 20 having its beveled sides 30 can be mounted on a printed circuit board 50 without having been encapsulated beforehand. The device 20 preferably has its cathode and gate metallizations 26 and 28 located on the side that is to be placed in contact with the printed circuit board 50 and suitable lands (not shown) are positioned to be coextensive with the metalizations 26 and 28 of the device 20. A film of solder paste is preferably placed between the device 20 and the printed circuit board 50 on the metalizations 26, 28 of the device 20 can be pressed down upon the solder during installation. While this will connect the gate and cathode to the printed circuit board circuitry, the anode metallization 52 is on the upper side of the device 20. To connect the anode metalization 52 to the printed circuit board, a lead frame, indicated generally at 54, is provided for interconnecting the anode to a land on the printed circuit board 50. To accomplish this interconnection, a film of solder paste 52 is placed between the anode metallization 20 and a left end portion 56 and between a land 55 on the printed circuit board and an opposite end 58 of the lead frame 54.

The lead frame 54 has an intermediate portion 60 between the end portions 56 and 58 and the intermediate portion 60 has a relatively large bend that extends between the chip 20 and the land on the printed circuit board 50. The relatively large bend 60 is provided to reduce thermally induced forces that may be developed due to various component CTE (Coefficient of Thermal Expansion) mismatches that occur in the widely varying ambient temperatures encountered in the harsh turbine engine environment. The lead frame is preferably manufactured of copper and has a thickness sufficient to conduct up to about 1500 amps of current for short periods of time during pulsing of the igniter when in an exciter circuit operation. Since the top surface of the device 20 may be at a different elevation relative to the surface of the printed circuit board where the end 58 is to be connected, both the ends 56 and 58 are bent in a direction transverse to the longitudinal direction of the lead frame and both are in the shape of a shallow V to minimize forces applied to the chip 20 during the solder reflow process. That is, as the solder solidifies, the V bends minimize rotational and normal forces applied to the chip and maximize alignment of the chip gate and cathode pads over their attendant PCB lands while likewise minimizing variability of the gate and cathode interconnect solder column heights.

In accordance with another embodiment of the present invention and referring to FIGS. 11–17, an output connector, indicated generally at 66, interconnects a pulse transformer assembly (not shown in detail) to an igniter plug in a turbine engine ignition exciter system via a cable (not shown) that is connected to the output connector 66. More particularly, the output connector 66 includes a connector bushing 68 which is preferably made of aluminum and provides a protective outer shield. The cable is inserted into the connector bushing 68 as well as into an insulator 70 that surrounds a contact pin 72 that has an intermediate diameter portion 74 with an enlarged flange 76 that fits within the insulator 70. The outer surface of the insulator 70 has a pair of annular grooves 78 which are configured to receive a pair of O-rings 80 which operate to seal the outside of the insulator 70 relative to the inside of the bushing 68. It has been found that the use of the O-rings, as contrasted with prior art methodology of merely injecting a silicon sealer between the two components, provides greater sealing reliability and is easier to install than injecting silicone between these two components. The insulator is preferably made of Ultem 2300, a 30% glass filled polyetherimide formulation manufactured by General Electric, which bring a higher level of heat resistance (400 degrees F. range), excellent chemical resistance, high dielectric strength, natural flame resistance, and extremely low smoke generation. The o-ring material is preferably fluorosilicone.

Figure 13:
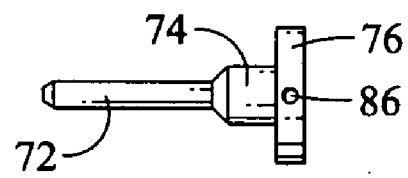
FIG. 13 is a side view of a cylindrical contact pin of the output connector.
Figure 14:
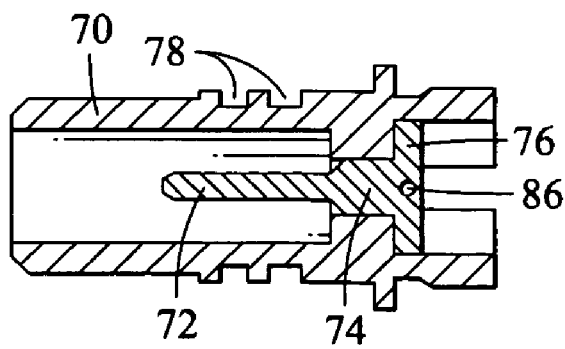
FIG. 14 is a cross-section illustrating the contact pin installed in the cylindrical insulator.
Figure 15:
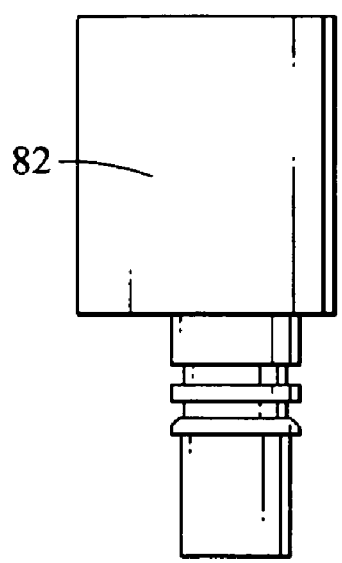
FIG. 15 is a top view of the output connector with a potting material enclosure applied to the pulse transformer assembly.
Figure 17:
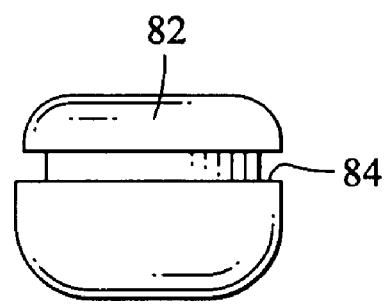
FIG. 17 is a rear view of the output connector with a potting material enclosure shown in FIG. 15.
Figure 16:
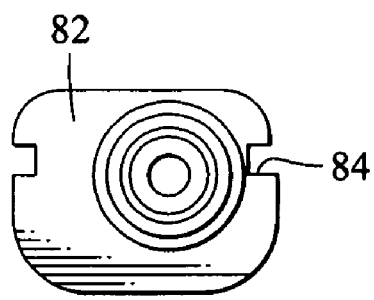
FIG. 16 is a front view of the potting material enclosure shown in FIG. 15.

A potting compound is preferably used to provide an enclosure 82 around the pulse transformer assembly and the connector bushing 68. The enclosure 82 has a horizontal slot 84 which is filled by the printed circuit board 50 and provides a sealed enclosure for the pulse transformer assembly and the bushing 68. That coupled with the use of the O-rings 80 completely seal the contact pin 72 from extraneous elements. As shown in FIGS. 13 and 14, an aperture 86 is provided in the end flange 76 in a transverse direction relative to the insulator 70 which has a slot 88 in line with the aperture 86. This permits an output conductor from the pulse transfer assembly to be connected to the contact pin 72 so that current can be conducted through the pin and cable to the igniter.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the following claims.

What is claimed is:

1. A method of fabricating a semiconductor power switching device comprising:
    forming a wafer having a plurality of individual circuit die configured in a matrix;
    dicing the wafer into individual circuit die by sawing at the interface between adjacent die with a circular abrasive saw blade having an angled configuration across its width to sever adjacent individual die from one another and form at least one beveled side surface on each of the adjacent die;
    forming metalization on top and bottom outer surfaces to define electrodes;
    bonding a thin elongated lead frame to said electrode metalization and extending said lead frame to a printed circuit board land and bonding the same to said land, said lead frame having opposite end portions and an intermediate thermal stress isolating bend, each of said end portions being respectively bonded to said land and said electrode metallization.

2. A method as defined in claim 1 wherein said saw blade has abrasive material bonded to the cutting surfaces of the blade, with the abrasive material having diamond particles embedded in the material.

3. A method as defined in claim 2 wherein said abrasive material is embedded with diamond particles.

4. A method as defined in claim 1 wherein said angled configuration has a cross section that slopes from each side to an increased blade radius at the center.

5. A method as defined in claim 1 wherein said saw blade is rotated at a speed range of about 20,000 rpm.

6. A method as defined in claim 4 wherein each of said slopes are at a predetermined angle.

7. A method as defined in claim 4 wherein said device is a power switching device having multiple semiconductor layers, at least one of each of a cathode, an anode and a gate electrode, and each of said slopes are of a predetermined angle.

8. A method as defined in claim 7 wherein said predetermined angle is about 45 degrees, said method further comprising:
etching said beveled sides with a bath of silicon etchant to remove surface irregularities caused by the sawing process and thereby smooth the surface of the bevel.

9. A method of fabricating a power switching device having multiple semiconductor layers, at least one of each of a cathode, an anode and a gate electrode, comprising:
forming a wafer having a plurality of individual circuit die configured in a matrix;
dicing the wafer into individual circuit die by sawing at the interface between adjacent die with a circular abrasive saw blade having an angled configuration across its width to sever adjacent individual die from one another and form at least one beveled side surface on each of the adjacent die;
etching said beveled sides with a bath of silicon etchant to remove surface irregularities caused by the sawing process and thereby smooth the surface of the bevel;
forming metalization on top and bottom outer surfaces to define the cathode, anode and gate electrodes;
bonding a thin elongated lead frame to said anode metalization and extending said lead frame to a printed circuit board land and bonding the same to said land, said lead frame having opposite end portions and an intermediate thermal stress isolating bend, each of said end portions being respectively bonded to said land and said anode metallization.

10. A method as defined in claim 9 wherein said bonding comprises soldering said lead frame to said anode metalization and to said land.

11. A method as defined in claim 10 wherein said soldering comprises placing solder on said circuit board land and on said anode metallization, placing said lead frame in contact with said circuit board land and said anode metalization and reflowing the solder to bond said lead frame to said circuit board land and to said anode metallization.

12. A method as defined in claim 11 wherein at least one of said opposite end portions is in the form of a shallow V shape, with the bottom of the V shape being transverse to the direction of length thereof and positioned to contact said solder.

13. A method as defined in claim 12 further comprising bonding said gate and cathode electrodes to respective lands on said printed circuit board.

14. A method as defined in claim 13 further comprising encapsulating said switching device mounted on said printed circuit board.

15. A method as defined in claim 14 wherein said encapsulating comprises placing a hollow generally firm topless shell of potting agent sized to surround said device and having a height greater than the height of said device and injecting a viscous flowable potting agent into said topless shell to encapsulate said chip, said potting agent flowing at least partially under said topless shell to seal the interface between the topless shell and the printed circuit board.

* * * * *